US 6,633,599 B2

(12) United States Patent
Murray et al.

(10) Patent No.: US 6,633,599 B2
(45) Date of Patent: Oct. 14, 2003

(54) ERBIUM-DOPED FIBER AMPLIFIER PUMP ARRAY

(75) Inventors: James T. Murray, Tucson, AZ (US); William Austin, Tucson, AZ (US)

(73) Assignee: Lite Cycles, Inc., Tucson, AZ (US)

( * ) Notice: Subject to any disclaimer, the term of this patent is extended or adjusted under 35 U.S.C. 154(b) by 288 days.

(21) Appl. No.: 09/920,535

(22) Filed: Aug. 1, 2001

(65) Prior Publication Data

US 2003/0072343 A1 Apr. 17, 2003

(51) Int. Cl.[7] .............................. H01S 3/094; H01S 3/04
(52) U.S. Cl. ............................................. 372/75; 372/36
(58) Field of Search .............................. 372/75, 36, 70, 372/69; 385/31

(56) References Cited

U.S. PATENT DOCUMENTS 5,185,758 A * 2/1993 Fan et al. ................... 372/72
5,455,838 A * 10/1995 Heritier et al. .............. 372/75

* cited by examiner

Primary Examiner—Quyen Leung
(74) Attorney, Agent, or Firm—Howard R. Popper

(57) ABSTRACT

A multimode source, such as a high-power laser diode bar, to pump an $Nd^{3+}$ doped region defined in a cavity of a monolithic crystal structure. The axial length L1 of the doped region is chosen to optimize energy absorption from the multimode source while minimizing resonant re-absorption loss to unpumped $Nd^{3+}$ ions. The next proximal cavity length L2 is an undoped region whose length is chosen to optimize the lowest order or fundamental spatial mode ("mode 9") of the cavity. Advantageously, multi-parameter numerical optimization techniques may be employed in which the parameter set (e.g., doped length, L1, doping concentration, pump beam spot size, micro laser cavity length, and output coupler reflectivity) is varied to determine the overall optimal length $L1_{opt}$.

16 Claims, 6 Drawing Sheets

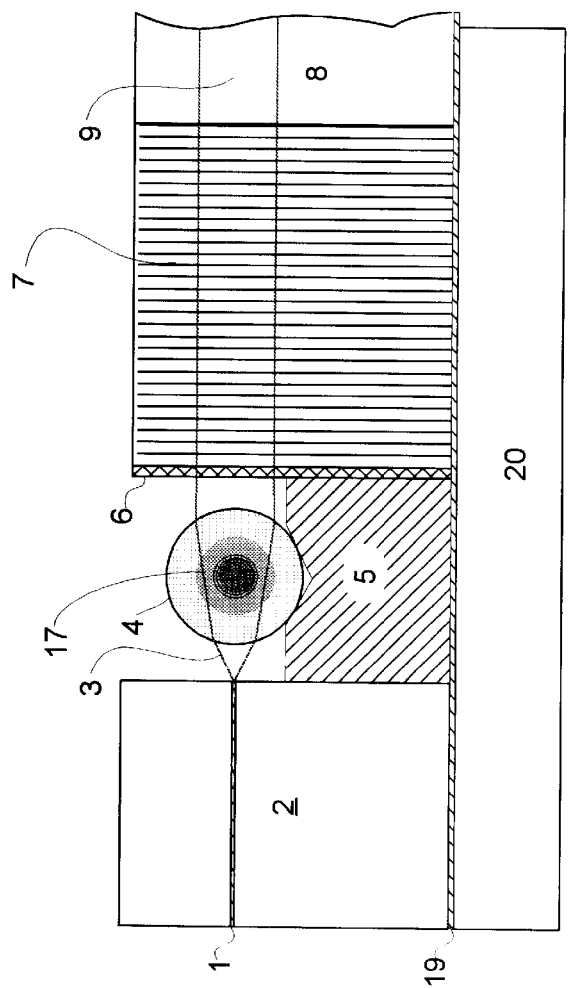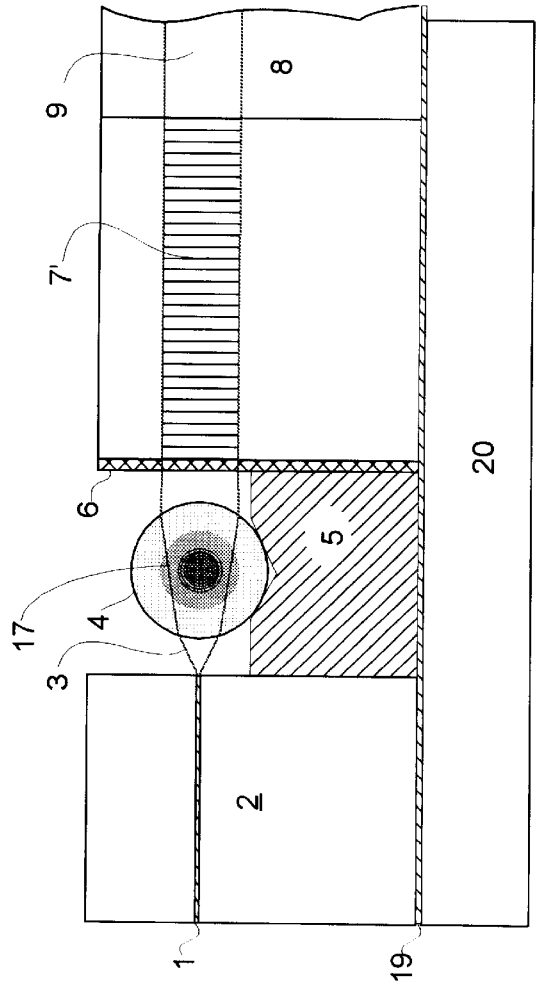

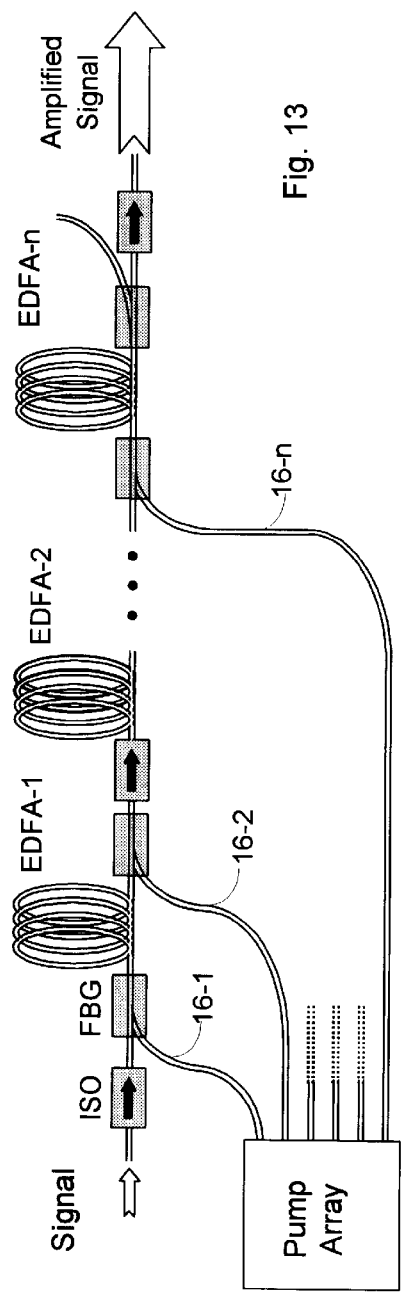
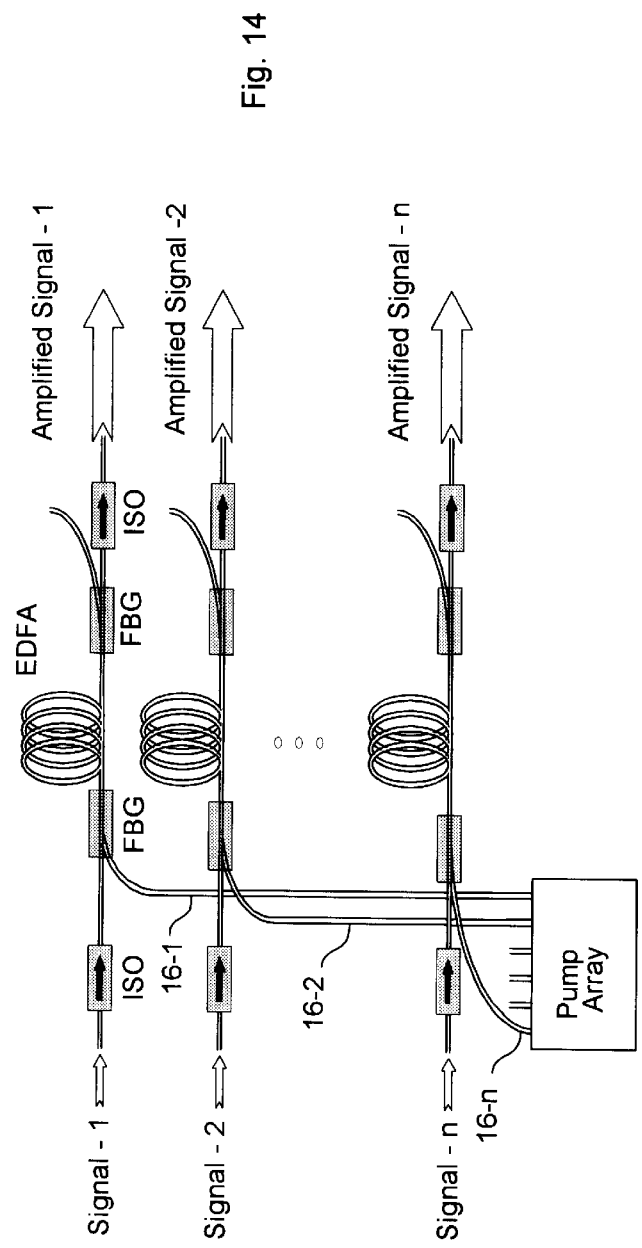

ERBIUM-DOPED FIBER AMPLIFIER PUMP ARRAY

FIELD OF THE INVENTION

This invention relates to single-mode power sources and more particularly to sources for delivering single-mode power to multi-channel devices.

BACKGROUND OF THE INVENTION

Erbium-doped amplifying structures EDFAs are capable of providing large optical bandwidth channel capacity and low noise properties but require an optical source of power pump whose wavelength must lie within a spectral region that is efficiently absorbed by either $Er^{3+}$ or co-doped $Yb^{3+}$ ions in the amplifying structure, i.e., 900 to 980-nm or 1450 to 1480-nm, respectively. To achieve efficient coupling between the laser source and the EDFA through a single-mode fiber "path cord" requires that the pump source be derived from a laser having a single spatial mode.

EDFA pump laser sources are typically derived from frequency stabilized single-mode fiber-coupled laser diodes c.f., U.S. Pat. No. 6,044,093 which use a fiber Bragg grating FBG that is highly transmissive at the C-band signal wavelength between 1530 and 1560-nm, and highly reflective at the pump wavelength, typically either 980 or 1480-nm. These devices have several drawbacks: They require frequency stabilization; they are relatively expensive and difficult to manufacture; and they have an inherent output power limitation due to the relatively low diode facet damage threshold.

In our copending application Ser. No. 09/734,112 filed Dec. 11, 2000 and entitled "Single Mode Pump Power Source", we describe an EDFA scalable high power pump source which converts the high-power, multimode output from a wide-stripe laser diode into a single-mode source of light within the pump band for either the $Yb^{3+}$ or $Er^{3+}$ ions of an EDFA.

Both the conventional fiber-coupled frequency-stabilized pump diodes and our above-mentioned micro-laser mode converter source are, however, single channel devices which provide pump power only to a single EDFA channel. Accordingly, a set of drive electronics as well as provision for cooling must be provided for each channel. In optical networking systems, where there are many tens or hundreds of EDFA's, this entails considerable cost and space. Accordingly, there is a need for a compact and efficient integrated pump source that is capable of delivering the requisite optical pump power to multiple EDFA channels.

SUMMARY OF THE INVENTION

In accordance with the principles of our invention, a compact and efficient source of single-mode power for driving multiple EDFA channels employs a multimode source, such as a high-power laser diode bar, to pump an $Nd^{3+}$ doped region defined in a cavity of a monolithic crystal structure. The axial length L1 of the doped region is chosen to optimize energy absorption from the multimode source while minimizing resonant re-absorption loss to unpumped $Nd^{3+}$ ions. The next proximal cavity length L2 is an undoped region whose length is chosen to optimize the lowest order or fundamental spatial mode ("mode 9") of the cavity. Advantageously, multi-parameter numerical optimization techniques may be employed in which the parameter set (e.g., doped length, L1, doping concentration, pump beam spot size, micro laser cavity length, and output coupler reflectivity) is varied to determine the overall optimal length $L1_{opt}$.

BRIEF DESCRIPTION OF THE DRAWING

The foregoing and other objects and features of the illustrative embodiment may become more apparent from a reading of the ensuing detailed description together with the drawing in which:

FIGS. 4 and 5 show enlarged partial side views of alternative doping configurations that can be employed in the monolithic crystal structure;

FIGS. 13 and 14 show the monolithic microlaser structure supplying power to a chain of serial EDFA and parallel EDFA devices.

DETAILED DESCRIPTION

Figure 1:
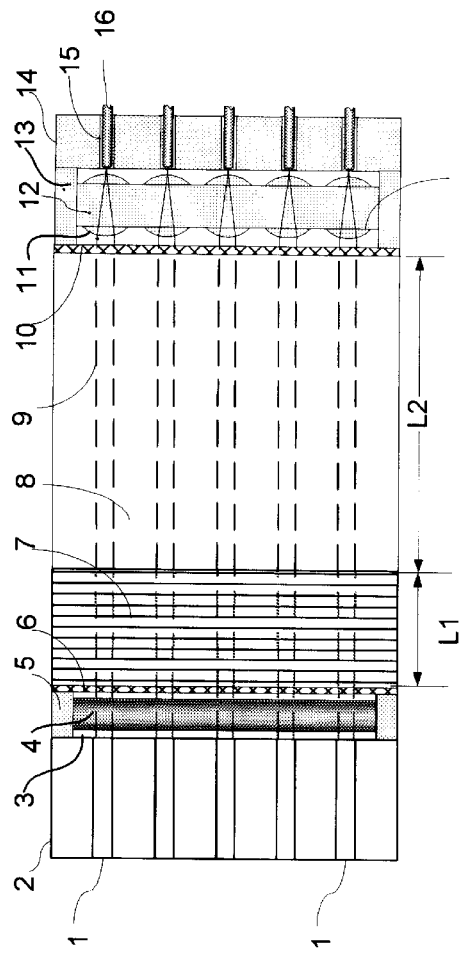
FIGS. 1 and 2 show top and side views of a monolithic microlaser structure according to the invention for supplying single-mode pump power to a fiber array.

In FIG. 1, a laser diode bar 2 pumps a monolithic crystal structure 7, 8 via a mode-matching lens 4 which reshapes the output radiations 3, 17 from the individual wide stripes 1 to match the fundamental modes of the microlaser cavities 9. The crystal structure is composed of a doped region 7 of length L1 and an undoped region 8 of length L2. (These lengths will be discussed hereinafter). In the doped regions 7, the dopant is the active lasing agent, typically $Nd^{3+}$ ions. The monolithic structure comprising the doped and undoped regions may be formed on a single crystal or individual crystals which are held in optical contact or fused together, advantageously through the use of well-known diffusion bonding technique. Reflective dielectric coatings 6 and 10 are applied to the input and output faces of the monolithic crystal to define the microlaser cavity 9. The input face coating 6 is preferably designed to be highly reflective (HR) at the lasing wavelength 910–1080 nm or 1440–1490 nm and highly transmissive (HT) at the pumping wavelength 780–850 nm. The exit coating 10, often called the output coupler (OC), is primarily reflective at only the laser wavelength; however, reflection at the pump wavelength may also be desired. The reflectively of the OC is set by design to optimize the power output from the laser.

Figure 2:
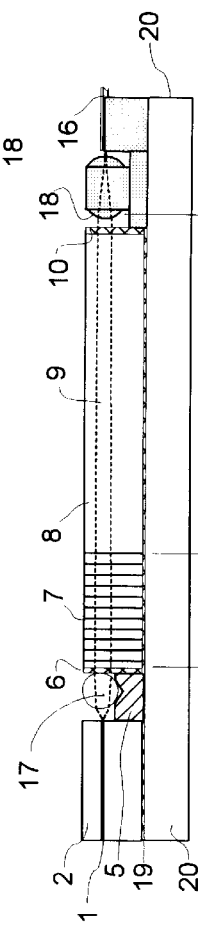
Figure 11:
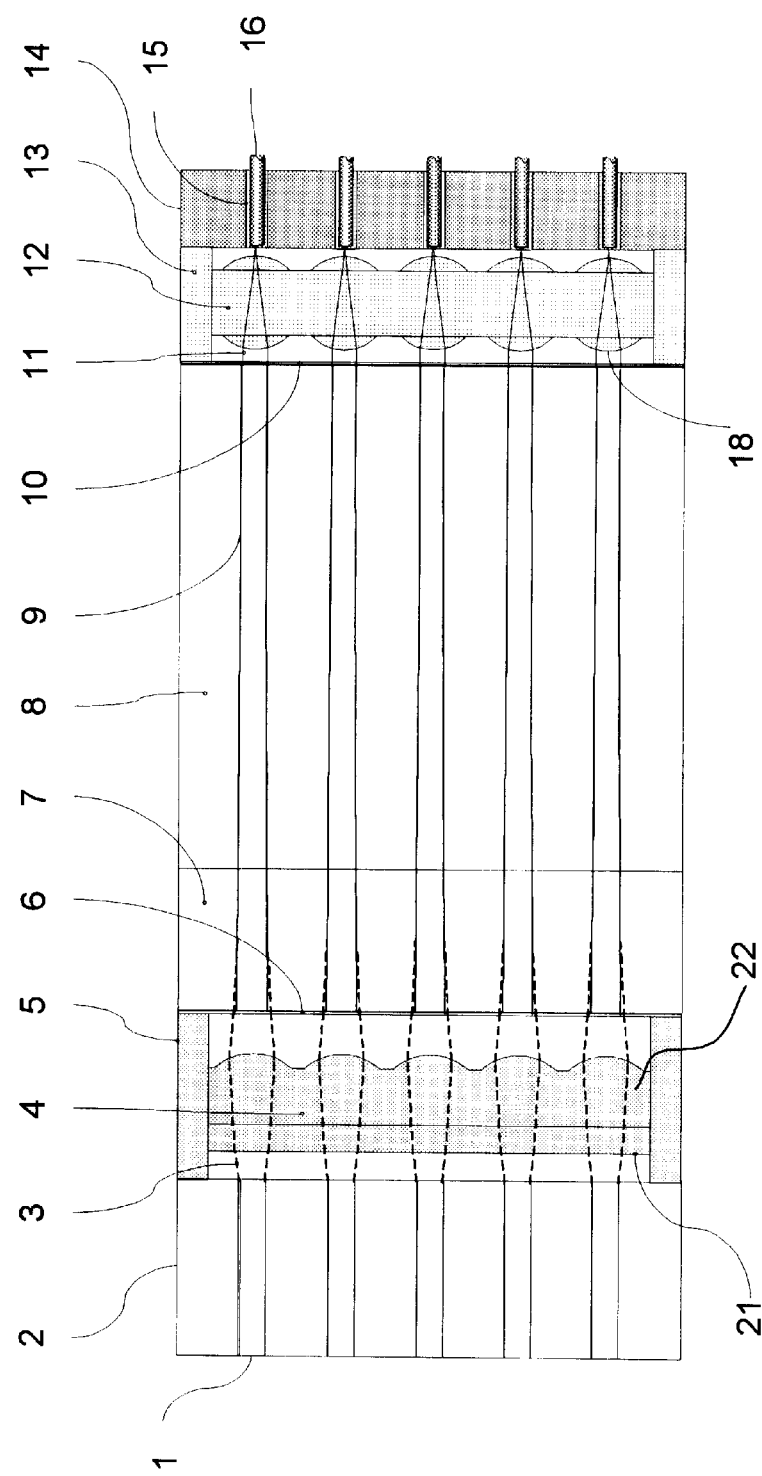
FIGS. 11 and 12 show top and side views of an embodiment using an alternative form of input lensing.
Figure 12:
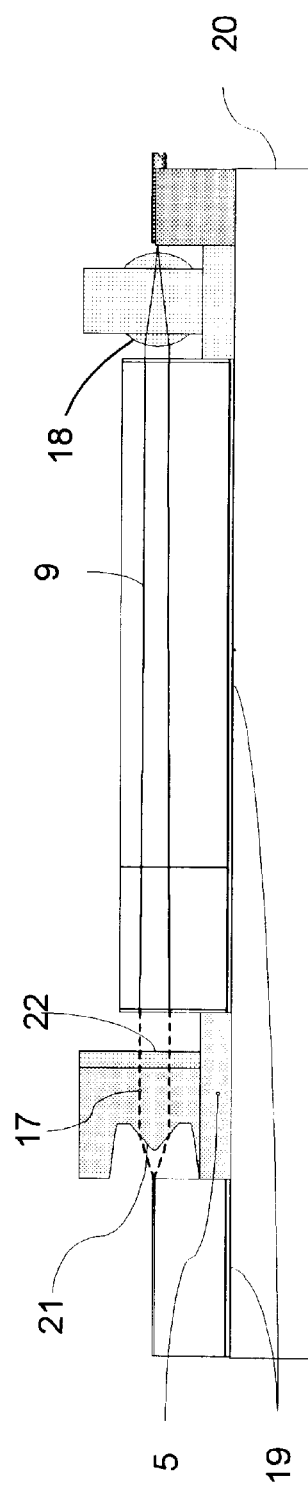

The cylindrical mode-matching lens 4 used in the illustrative embodiment of FIGS. 1 and 2 collimates the fast axis of the individual diode laser emitters in the diode bar array and is fixed in place by mounting structures 5 that may contain a V-groove as shown or may simply be glued using UV-curing epoxy to the diode array 2. An alternative configuration, in which a lens is used to collimate both axes of radiation, is shown in FIGS. 11 and 12. Mode matching is achieved when the 3-dimensional shape of the multimode beam emitted from the individual emitters 1 matches the shape of the single-mode beam 9 within the microlaser cavity. When proper mode matching is achieved, the output beam 11 from each microlaser will be single-mode in nature, and can thus be coupled via lenslet array 12 into individual single-mode fibers 16. The shape of the individual lenslets 18 within the lenslet array 12 is designed to optimize the coupling efficiency between the microlaser output 11 and single-mode fibers 16. Individual V-grooves 15 hold the fibers in place, and active beam alignment is used to align the individual single mode fibers to the corresponding microlaser focused output beam. UV-curing epoxy is used to secure the fibers in place once they are aligned. Optical power generated by the microlasers are delivered to individual EDFAs in a network via the single-mode fibers 16, as shown in FIGS. 13 and 14.

Heat, which is generated in both the laser diode bar 2 and monolithic structure 7, 8, is removed though a heatsink 20 located on the bottom of the device. A thermally conductive bonding agent 19, which is preferably indium solder, is applied between the laser diode bar 2 and heat sink 20 and between the heat sink 20 and the microlaser crystals 7 and 8.

The microlaser of FIGS. 1 and 2 acts as both a spectral and spatial mode converter since both the wavelength and the spatial mode distribution of the laser diode emitter are converted via the lasing process to a mode that is appropriate for pumping EDFAs. Moreover, the microlaser also serves as a "brightness" converter since the spatial mode of the diode emitter, which is multimode in nature, is converted to a single-mode $TEM_{oo}$ beam, which can be focused and efficiently coupled into a single-mode fiber.

In the above-mentioned copending application, we describe how commercially available aluminum gallium arsenide AlGaAs diodes can be used to pump microlasers doped with $Nd^{3+}$ active ions to achieve optical power that is appropriate for pumping EDFAs. Specifically, the diode laser operates at a wavelength that corresponds with the $^4I_{9/2} \rightarrow ^4F_{5/2}$ absorption band of $Nd^{3+}$ ions doped within a laser host crystal. The absorbed energy is re-radiated by the $Nd^{3+}$ ions into the $^4F_{3/2} \rightarrow ^4I_{9/2}$, $^4F_{3/2} \rightarrow ^4I_{11/2}$, and $^4F_{3/2} \rightarrow ^4I_{13/2}$ transitions, which spectrally overlap the 980 and 1480-nm pump bands of $Er^{3+}$ and/or $Yb^{3+}$ when doped in the appropriate host crystal. In this example we will present a detailed design of a microlaser array based on $Nd^{3+}$ doped yttrium aluminum garnet YAG crystals lasing on the $^4F_{3/2} \rightarrow ^4I_{9/2}$ transition. The output wavelength of this device is 946-nm, which has significant overlap of the 980-nm pump band of co-doped Yb/Er EDFAs. Nd:YAG is chosen due to its high ground state splitting energy 857 $cm^{-1}$, high thermal conductivity 14 W/m-K, and wide commercial availability.

In the preferred embodiment, the diode bar array 2 is fabricated using aluminum gallium arsenide AlGaAs, and in particular, $Ga_{0.93}Al_{0.07}As$. Diode lasers based on this AlGaAs or other similar compounds efficiently generate laser radiation at 808-nm, which corresponds with the peak absorption of $Nd^{3+}$ ions within the doped YAG region of the microlaser material 7. High-power wide-stripe diode laser bar arrays operating at 808 nm are commercially available from several major suppliers e.g., Coherent, Opto Power, Siemens, Thomson CSF, etc. Wide-stripe emitters are known to reliably operate at powers of up to 15 mW/$\mu$m of emitter width without damage. Common emitter widths are between 100 and 200-$\mu$m, hence the maximum reliable output power per emitter is approximately 1.5 to 3.0 W. We have based our initial designs on 150-$\mu$m wide, 2.25-W emitters, which are commercially available form Coherent Corporation, Semiconductor Group Santa Clara, Calif. Coherent diode bar array model number B1-81-40C-19-30-A contains 19, 150-$\mu$m diode laser emitters spaced 500-$\mu$m apart i.e., 350-$\mu$m dead space between emitters.

The vertical dimension of wide-stripe diode emitters 1 is typically on the order of 1-$\mu$m, which confines the spatial intensity distribution in the vertical direction fast-axis to a single spatial mode. Hence, the radiation in the vertical direction is nearly diffraction-limited. Specifically, the single mode half-width at the exit aperture of the diode, and the far field divergence in the fast axis is typically $\omega_f \cong 0.47$-$\mu$m and $\theta_f \cong 544$ mrad, respectively, where the divergence and beam radius are measured at the $1/e^2$ half-width points. Contrarily, the spatial intensity distribution in the horizontal plane slow axis is confined by the wide-stripe, which is several times larger than the single spatial mode distribution. Hence, the radiation in the horizontal direction is several times diffraction-limited, and in the case of the 150-$\mu$m wide emitters, the radiation diverges at approximately 36-times the diffraction-limit i.e., $M^2 \cong 36$ in the far-field. The multimode $1/e^2$ beam half-width in the exit aperture of the diode and far-field half-angle divergence for a 150-$\mu$m emitter is approximately $W_s \cong 75$-$\mu$m, and $\Theta_s \cong 124$ mrad, respectively. Owing to the radically different beam sizes and divergences in the two orthogonal planes, a lens 4 is required to reshape the emitter beam so that it adequately matches the approximate shape of the microlaser mode volume 9. This process is called "mode matching" since the mode of the diode laser emitter is reshaped to match the mode of the microlaser cavity fundamental mode. When mode matching is accomplished, the microlaser will operate in a single spatial mode, which is a requirement for efficient coupling into a single-mode EDFA fiber.

Figure 3:
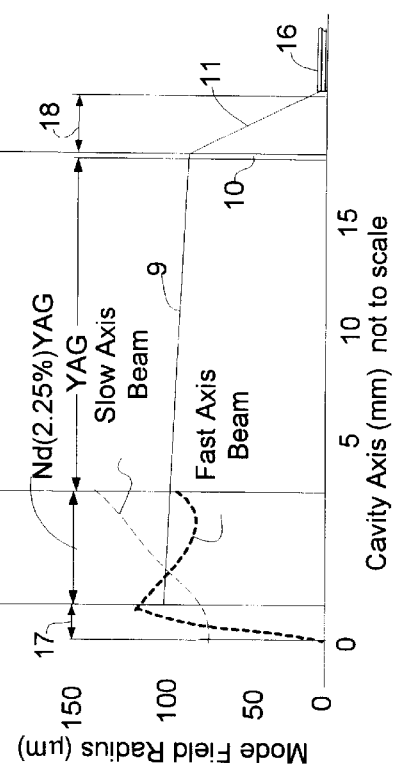
FIG. 3 shows the beam envelopes of the pump and microlaser modes as a function of distance along the optical axis.

In the embodiment of FIGS. 1 and 2, the mode-matching lens 4 is a rod of gradient index (GRIN) material. In this embodiment, the rod lens focuses and quasi-collimates the fast-axis radiation from the diode emitter in a manner such that its beam envelope 17 (see the enlarged view, FIG. 4), approximately matches the freely expanding slow-axis beam envelope 3 within the doped region of the laser crystal 7. When matched, the reshaped fast-axis beam envelope and freely expanding slow-axis beam envelope form an approximately circularized beam within the doped region 7 of the micro-laser cavity 9. Ideally, the circularized beam cross section matched the single mode beam distribution within the micro-laser cavity. The size of the fundamental mode in the microlaser is dependent mainly on the thermal focal length induced in the laser medium and the microlaser cavity length. The cavity length is easily controlled by varying the length L2 of the undoped crystal region 8, so the undoped crystal length L2 is used as a design parameter to fine-tune the mode matching between the pump and laser mode. FIG. 3 shows the beam envelopes of the pump and microlaser modes as a function of distance along the optical axis. The fast and slow axes of the pump beam are shown as the dotted and dashed lines on the left-hand side of FIG. 3. The laser mode beam envelop within the micro laser cavity is shown as a solid line, and the exit beam is shown as a dash-dot line.

Figure 6:
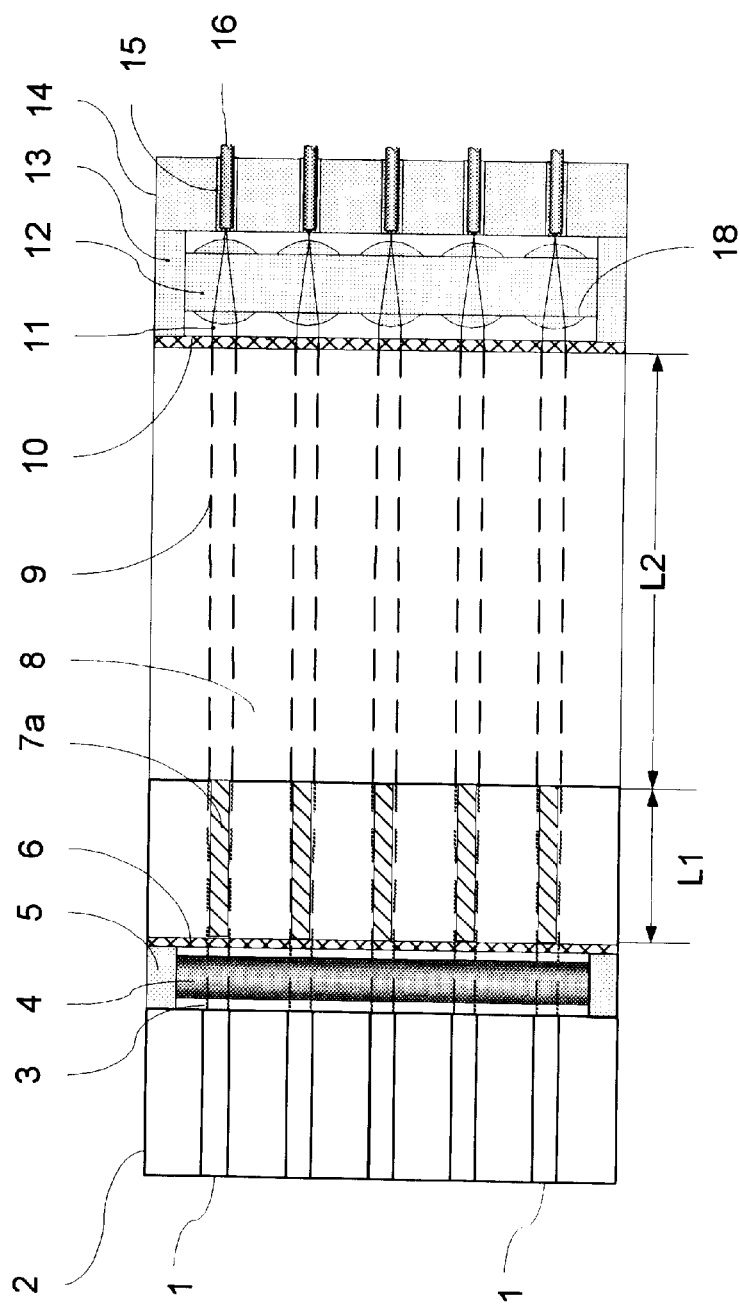
FIGS. 6 and 7 shows a top and side views of a further alternative doping configuration that can be employed in the monolithic crystal structure.
Figure 7:
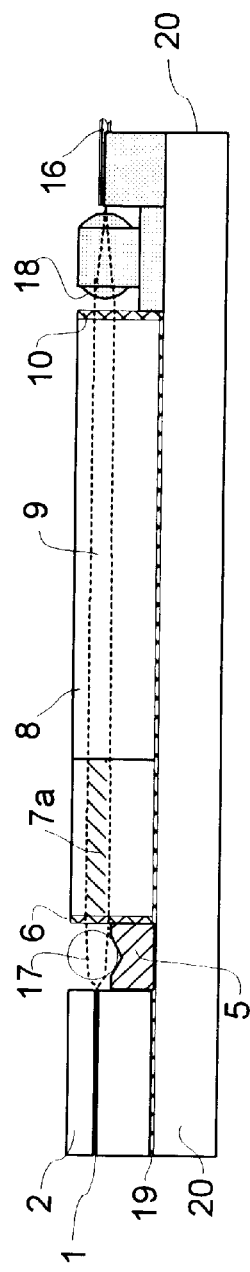

FIGS. 5, 6 and 7 show alternative embodiments in which the doped sections 7' and 7a, respectively, of the crystal structure is narrower than the beam 9 collimated by lens 4 from pumping diode 2. The configuration of FIGS. 6 and 7, in which doping 7a is confined to the beam width in two dimensions, has the advantage that re-absorption losses can be reduced in the wings of the laser beam profile. FIG. 5 shows an enlarged side view of an embodiment in which the doping 7' is narrower than the beam width in one dimension. The re-absorption losses are highest where the laser beam intensity is low; i.e., in the wings of the beam profile, which is Gaussian distributed. High laser intensity is required to saturate (i.e., bleach) the quasi-three-level laser transition. Saturation occurs in the center of the beam where the laser intensity is high. The re-absorption loss can be removed completely in regions where the beam intensity is low by removing active ions completely. This is the nature of the above embodiment. The unsaturated ions in the wings of the laser beam have been removed, thus removing the loss. The re-absorption loss can be reduced further still by removing ions on the sides of the beam as well as on the tops and bottom.

Figure 8:
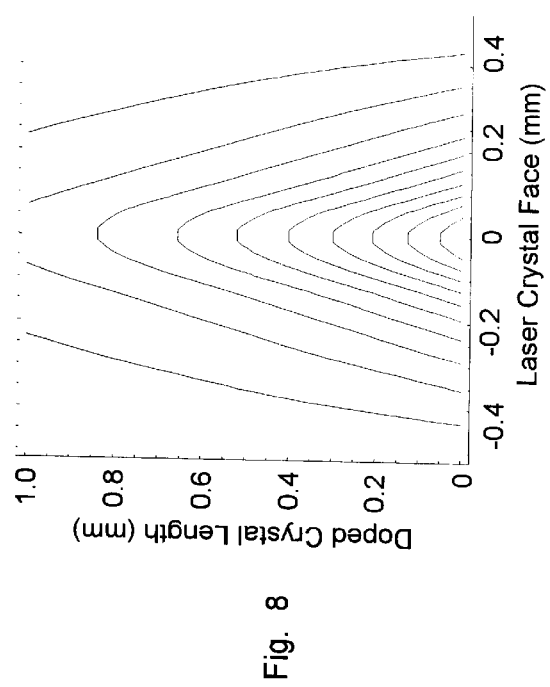
FIG. 8 shows the temperature distribution in a symmetry plane of the pumped microlaser crystal structure of FIGS. 1 and 2.

Thermal lensing results from localized heating caused by the finite quantum defect between the pump and lasing radiation. The heat source distribution within the crystal closely matches the diode pump beam intensity distribution in the laser medium. Heat is diffused from the hot central pumped regions into the cooler un-pumped regions of the laser medium, thus leading to a temperature distribution that depends mostly on the geometry of the heat source and somewhat on the geometry of the heat sink i.e., crystal edges. In the cases considered here, the temperature distribution is approximately circularly symmetric, and the functional dependence is closely represented by the contours in FIG. 8. Light traveling in the hot regions of the medium typically moves slower than light in the cold regions, which is due to the temperature-dependent index of refraction. Therefore, the phase of a light beam passing through the perturbed medium will be significantly perturbed. This phase distortion is parabolic to first order, giving rise to a distinctive "lensing" of the beam, which is called "thermal lensing" in the art because it is due to the localize heating of the medium. In the cases considered here, the effective thermal focal length is typically between 50 and 150-mm depending on the cross sectional size and shape of the pump beam, and its optical power. The strength of the induced thermal lens and the length of the microlaser cavity are design parameters that can be used to "tune" the fundamental microlaser mode size until it matches the pump radiation distribution. Conversely, the pump radiation distribution can be reshaped to match the microlaser mode size. FIG. 8. shows the temperature distribution in a symmetry plane of the pumped laser crystal. In the case shown, the total pump power is 2.25-W, the pump and laser distribution is 200-$\mu$m in diameter, the crystal length is 1.0-mm, and the crystal height is 1.0-mm.

The $^4F_{3/2} \rightarrow {}^4I_{9/2}$ transition in $Nd^{3+}$ is a quasi-three-level transition, and thus contributes additional re-absorption loss to the oscillating laser beam in regions that are not strongly pumped. Therefore, it is essential to optimize the pumping configuration, crystal length, and doping concentration to assure that all regions traversed by the oscillating laser beam are strongly pumped. The pump radiation intensity decreases exponentially with distance due to absorption, thus leaving a large percentage of the $Nd^{3+}$ ions located beyond the absorption depth in a non-excited state. In a quasi-three-level system, unexcited ions contribute to re-absorption loss rather than gain. Reducing the doped region 7 of the laser crystal decreases the re-absorption loss; however, it also reduced the absorption efficiency. Therefore, the length of the doped region in the crystal must be optimized to maximize the pump absorption efficiency and minimize re-absorption loss. Another, strategy is to halve the doped region in the crystal and re-circulate the pump radiation by using a reflective coating at the pump wavelength between the doped region 7 and the undoped region 8. Although this strategy has the potential to improve the laser performance, it is difficult and expensive to implement in practice.

The pump spot size has a large affect on the laser performance. The laser gain is exponentially dependent on the pump intensity, so minimizing the pump beam size improves the overall laser extraction efficiency. However, the diffraction spreading of the pump beam increases linearly with decreasing pump spotsize; thereby degrading the pump-to-laser mode overlap efficiency. Therefore, the pump spotsize must also be optimized to maximize the laser gain and the spatial mode overlap.

Although the pump radiation can be shaped to match the single-mode beam shape within the laser crystal, it cannot maintain the shape over long distances due to its multimode nature. Therefore, shorter doped crystal lengths are preferred to improve the mode overlap, which counteracts the absorption efficiency requirements for longer crystal lengths. The $Nd^{3+}$ doping percentage also plays a role in the length optimization because it can be used to tune the absorption depth of the pump radiation. Therefore, larger doping concentrations enable shorter crystal lengths. However, the high doping concentrations also lead to deleterious spectroscopic effects, such as shortened upper-state lifetimes, cross-relaxation, and energy migration. Therefore, the doping percentage should also be optimized to minimize the crystal length without severely degrading the laser performance.

Laser radiation escapes through the OC, which is partial reflective. A finite reflectivity is required to feed back enough radiation in the laser to efficiently stimulate and extract additional radiation from the excited $Nd^{3+}$ ions, and further saturate $Nd^{3+}$ ions that can contribute to re-absorption loss. Conversely, finite transmission is required to couple out useful radiation. Therefore, the output coupler reflectivity must be optimized to maximize the laser output power.

It is clear that many dependent parameters affect the performance of the laser. Therefore, a multi-parameter optimization must be performed to determine the optimum laser design. The average output power from a CW (continuous wave) quasi-three-level laser is given by:

$$P_{CW} = \frac{\langle A_L \rangle I_{sat}}{2\beta} \frac{\delta_{OC}(1+B)}{(1+f_{\mathit{eff}})} [\langle \eta_{cw} \rangle - 1] \quad (1.1)$$

where:

$$\langle A_L \rangle = \int i_L(r) dA_h \quad (1.2)$$

is the effective laser mode (beam) area within the host crystal;

$$I_{sat} = \frac{h\nu_L}{f_a \sigma_{em} t_a} \quad (1.3)$$

is the saturation intensity of the active laser ions with in the laser host crystal;

$$\beta = \frac{\int i_L^2(r) i_P(r) dA_h}{\int i_L(r) i_P(r) dA_h} \quad (1.4)$$

is a field overlap factor;

$$\delta_{OC} = -\ln R_{OC} \quad (1.5)$$

is the output coupler reflectivity loss exponent;

$$B = \frac{2 f_b \sigma_{abs} n_o l_h}{\delta} \quad (1.6)$$

is the ratio of the resonant re-absorption loss to passive roundtrip cavity loss;

$$f_{eff} = \frac{f_b \sigma_{abs}}{f_a \sigma_{em}} \quad (1.7)$$

is the effective bottle-necking parameter; and $$\langle \eta_{CW} \rangle = \frac{2}{\delta(1+B)} \left( \frac{I_{av}}{I_{sat}} \right) \quad (1.8)$$

is the spatially-averaged CW inversion density ratio.

In Eqs. (1.2) and (1.4) $i_L(r)$ and $i_P(r)$ are the peak-normalized laser mode and pump beam distribution functions, respectively. In Eq. (1.3) h is Plank's constant; $V_L$ is the laser beam frequency.

The laser transition occurs between an upper (a) and lower (b) multiplet transition. Each multiplet level contains numerous Stark sub-levels. The actual laser transition is between particular Stark sub-levels within the upper and lower multiplet level. $f_a$ and $f_b$ in Eqs. (1.3), (1.6), and (1.7) are the Maxwell-Boltzmann fractional population density factors for these particular Stark sub-levels. $\sigma_{em}$ and $\sigma_{abs}$ in Eqs. (1.3), (1.6), and (1.7) are the emission and absorption cross-sections, respectively, of the host laser ions measured at the frequency of the laser transition. $t_a$ in Eq. (1.3) is the fluorescence lifetime of the upper multiplet level for the laser transition. $R_{OC}$ in Eq. (1.5) is the intensity reflectivity of the output coupler at the laser wavelength. $n_o$ in Eq. (1.6) is the active ion concentration (i.e., doping level) within the host crystal, and $l_h$ is the length the laser beam traverses within the doped section of the host crystal (i.e, $l_h$=L1). $\delta$ in Eqs. (1.6) and (1.8) is the net loss exponent (excluding the output coupler reflectivity) at the laser wavelength for one roundtrip of the cavity, which is given by $$\delta = 2 \sum_i \alpha_i l_i - 2 \ln \prod_i T_i^2 - \ln \prod_i R_i \quad (1.9)$$

where $\alpha_i$, $l_i$, and $T_i$ are the absorption coefficient, length, and transmission of the $i^{th}$ element in the cavity at the wavelength of the laser, and $R_i$ is the intensity reflectivity of the $i^{th}$ mirror (excluding the output coupler mirror) in the laser cavity at the laser wavelength. $I_{av}$ in Eq. (1.8) is the "available" pump intensity supplied by the pump source, which is given by $$I_{av} = \frac{P_a}{\langle A_L \rangle} \quad (1.10)$$

where $P_a$ is the available pump power. The available pump power is related to the actual (i.e., measurable) pump power, $P_P$, by the relation $$P_{av} = \eta_{total} P_P \quad (1.11)$$

where $$\eta_{total} = \eta_{trans} \eta_{abs} \eta_{qe} \eta_{qd} \eta_{spec} \eta_{area} \eta_{over} \quad (1.12)$$

is the net pumping efficiency of the process, which encompasses all the loss mechanisms associated with transferring energy (power) from the pump source to the upper laser level.

In Eq. (1.12), there are seven separate terms: The optical transfer efficiency, $\eta_{trans}$; absorption efficiency, $\eta_{abs}$; quantum efficiency, $\eta_{qe}$; quantum defect, $\eta_{qd}$, spectral overlap efficiency, $\eta_{spec}$, area efficiency, $\eta_{area}$, and pump to mode distribution overlap efficiency, $\eta_{over}$. Typically, optical transfer efficiency is $\eta_{trans}$; 0.8 to 0.95 for monochromatic (laser diode) pumping, depending on the number and quality of the optical elements used between the pump and host medium. The absorption efficiency is dependent on the pumping geometry, and has the general functional form of $\eta_{abs} = 1 - exp[-\alpha_P l_P]$, where $\alpha_P$ is the absorption coefficient of the host crystal at the pump frequency, and $l_P$ is the length of the pumped region (typically, $l_P = l_h$). The quantum efficiency, $\eta_{qe}$, is a measure of the purity of the quantum mechanical transfer process between the pump multiplet and upper laser transition multiplet. Defects and impurities in the host can trap or transfer pump energy, reducing the transfer efficiency to the upper manifold. Typically, $\eta_{qe}$; 0.85 to 0.95, and is largely dependent on the quality of the material used. The quantum efficiency factor can be strongly dependent on the pump field intensity due to nonlinear transfer mechanisms, such as Auger up-conversion or cross relaxation. Although these mechanisms can be easily modeled, specific values for the up-conversion coefficients are not well known. The quantum defect, $\eta_{qd}$, accounts for the energy difference between the pumping and lasing fields, which is given up as heat in the host medium. For narrow, monochromatic, pump sources (e.g. laser diodes), $\eta_{qd}$ is simply the ratio of wavelengths; i.e., $\eta_{qd} = \lambda_P / \lambda_L$. The spectral overlap efficiency, $\eta_{spec}$, is the ratio of the integrated spectral overlap between the absorption bands in the host medium to the emission spectrum of the pump source. In the case of monochromatic pumping (e.g. laser diodes), $\eta_{spec}$ is normally quite large, and is typically $\eta_{spec}$; 0.8 to 0.98. The area efficiency, $\eta_{area}$, is the ratio of the effective area of the pump and laser mode intensity distributions, $i_L(r)$ and $i_P(r)$, respectively; i.e., $\eta_{area} = \langle A_L \rangle / \langle A_P \rangle$. The pump to laser mode distribution overlap efficiency is given by, $\eta_{over} = \int i_L(r) i_P(r) dA_h / \langle A_L \rangle$, and is a consequence of the spatial averaging approximation.

The expression for the output CW power given by (1.1) is general and can be used to model the performance of both quasi-three and four level laser systems. Laser design optimization is performed by computer design parameters, such as the crystal length, $l_h$, active ion doping concentration, $n_o$, and pump beam area, $\langle A_P \rangle$, are varied to achieve the highest efficiency between the pump and output laser power given the constraints and nature of the material and pump source.

This procedure was used to optimize the design of the EDFA pump array micro-laser.

Some of the parameters in equation 1.1 are variable and some are fixed. The variable parameters are 'system' parameters that can be set by design. Examples of system parameters are: The output coupler mirror reflectivity, $R_{OC}$, which enters in the expression for $\delta_{OC}$; and the pump beam spot size, which enters indirectly through the expressions for $\beta$ and $<\eta_{CW}>$. Fixed parameters cannot be varied by design. These parameters are called 'material' parameters because they are parameters associated with the specific laser material (crystal) implemented by the design. Examples of material parameters are: The saturation intensity, $I_{sat}$; and the effective bottle-necking parameter, $f_{eff}$. These parameters will never change unless that crystal host material (crystal) changes. Note that not all the parameters associated with the laser host crystal are fixed. The Nd-ion doping concentration, $n_o$, and the doped crystal length, $l_h$, are both variable since they can be set by growth and fabrication, respectively.

The problem of multi-parameter optimization is to find the set of variable parameters that maximize the output power, $P_{CW}$, for a given set of fixed parameters. There are, of course, physical limits to the range over which parameters can vary. In addition, some parameters, although variable, may be fixed by other constraints; e.g., the input pump power from the laser diode emitters. It is highly desirable to fix as many parameters as possible since the complexity of the optimization procedure grows exponentially with the number of variable parameters. In the general case of multi-parameter optimization, solutions are found using sophisticated mathematical techniques. However, when the number of variable parameters reduces to two or less, the procedure is trivially solved using elementary calculus or graphical techniques.

In the illustrative embodiment it was possible to fix all but three parameters: $R_{OC}$, $n_o$, and $l_h$. The procedure for finding the optimum solution is as follows:

(1) Take the derivative of Eq. (1.1) with respect to $R_{OC}$ and set the resulting expression to zero. Solve the resulting expression for $R_{OC}$, which we will label $R_{OC}^{opt}(n_o,l_h)$, since it is the optimum output coupler reflectivity at a given design point as a function of the Nd-ion doping concentration, $n_o$, and doped crystal length, $l_h$. This expression is substituted back into Eq. (1.1), which now is a function of only $n_o$ and $l_h$, i.e., $P_{CW}(n_o,l_h)$.

(2) With the expression $P_{CW}(n_o,l_h)$ fix the value for the Nd-ion doping concentration at one value, say $n_o$=0.25 wt. %, and calculate and plot the curve for $P_{CW}(0.25,l_h)$ as a function of the crystal length, $l_h$. The curve should increase due to the increasing absorption efficiency until a maximum is achieved. Further increasing the length causes the curve to begin to decrease due to the mounting re-absorption loss, which increases length, $l_h$.

(3) Step the Nd-ion doping concentration by some small amount, say 0.25 wt. %, and repeat step (2).

(4) Repeat step three until the concentration value is unreasonably high, say 7 wt. %.

(5) Plot all the curves simultaneously on the same graph and observe where the optimum output power lies; i.e., on which curve and at which length. The curve sets the optimum doping concentration and the length sets the optimum doped crystal length.

Figure 9:
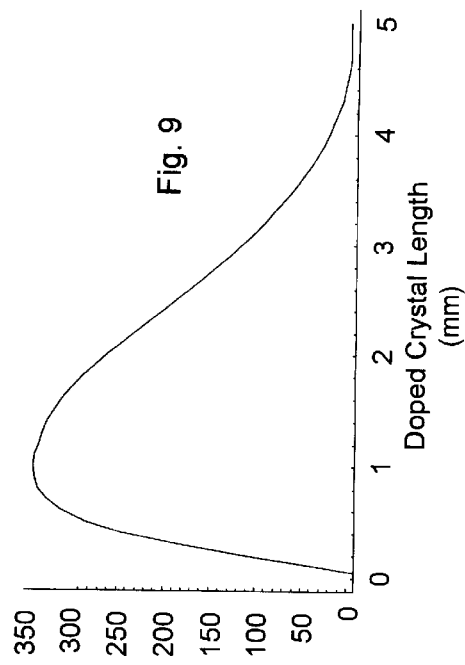
FIG. 9 is a plot of the optimized optical output power at 946-nm for a Nd:YAG microlaser pumped by a 150-$\mu$m wide-stripe laser diode operating at maximum power of 2.25 W.
Figure 10:
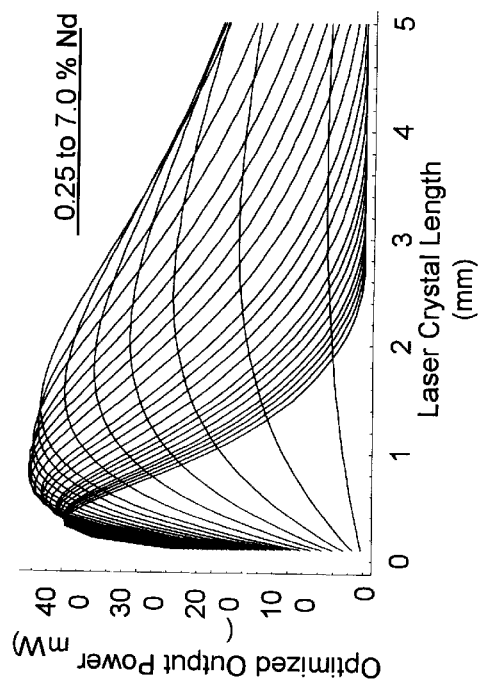
FIG. 10 shows the CW output power of an illustrative embodiment for different Nd-ion doping concentrations as a function of doped crystal length.

The above procedure has been carried out in illustrative embodiments the results being shown in FIGS. 9 and 10.

FIG. 9 shows the results of a computer model calculation optimized to produce 2.25 W optical output power at 946-nm from a Nd:YAG microlaser pumped by a 150-$\mu$m wide-stripe laser diode. The doping concentration, pump beam spotsize, microlaser cavity length, and output coupler reflectivity are varied along each point on the curve to obtain the optimum microlaser performance as a function of the doped region length L1.

The length of the $Nd^{3+}$-doped host crystal region, L1, can vary between 0.1 to 5-mm; the $Nd^{3+}$ doping concentration can vary form 0.25 to 5 wt %; and the size of the $Nd^{3+}$ doped region can vary between 0.1 to several times the fundamental beam (9) size, which is typically around 200-$\mu$m $1/e^{-2}$ diameter. Preferably, the transverse size of the doped region is smaller by a factor of about two than the mode size diameter. This assures that $Nd^{3+}$ ions exist only in regions where the laser intensity is high; thus minimizing the resonant re-absorption loss, which is largely dependent on the strength of the laser field. The pump laser beam diameter must likewise be conditioned by lens 4 to match the size of the doped region to assure adequate absorption efficiency of the pump radiation. We predict that this technique may as much as double the output power of the microlaser, leading to output powers on the order of 700-mW per micro laser in the array.

In FIG. 10 each curve represents the output CW power of the laser for a different Nd-ion doping concentration as a function of the doped crystal length. The lowest sloping curves are the low concentration curves, starting with 0.25 wt. percentage $Nd^{+++}$, with progressively higher doping levels to the left. The optimum performance (i.e., highest output power) occurs for the curve corresponding to a doping percentage of 3.25 wt. %, at a length of 0.8-mm. Hence, the optimum values for $n_o$ and $l_h$ have been determined. The optimum output coupler reflectivity at this point is $R_{OC}^{opt}$=96%, which is found be substituting the optimum doping concentration and doped crystal length into the analytical expression for the optimum output coupler reflectivity.

The microlaser configuration of FIGS. 1 and 2 provides a diode laser pump source wherein each microlaser is a single 150 $\mu$m emitter that outputs a maximum of 2.25 W. The optimum output power is approximately 350-mW at 946-nm, which is achieved at a 15.6% optical-to-optical efficiency. The optimum microlaser parameters for this configuration are given in Table 1.

TABLE 1

| Parameter | Value |
| --- | --- |
| Doped Crystal Length | 1 mm |
| Nd Doping Percentage | 2.25% |
| OC Reflectivity | 96% |
| Undoped Crystal Length | 15 mm |
| Pump and Laser Mode Diameter $1/e^2$ | 200 $\mu$m |

A rod lens with 350 $\mu$m diameter located 60 $\mu$m from the diode facet produces the appropriate pump beam profile to approximately match the pump-to-laser modes within the doped region of the crystal. The rod lens can be replaced with a GRIN rod lens, which improves the collimation and the alignment sensitivity. FIG. 3 shows the pump and laser mode envelopes as a function of distance along the optical axis. The output from the illustrative microlaser cavity is focused by a 680 $\mu$m focal length lenslet 18, and is coupled into a 980 nm single-mode fiber patch cord, which is commercially available form Corning HI980. The mode field diameter of the Corning HI980 fiber is 4.2 $\mu$m and the fiber NA is 0.14.

FIGS. 11 and 12 show an alternative embodiment where microlens 4 is a compound microlens array having correction in both the fast and slow axis. The fast axis is corrected by a hyperbolic surface 21, and the slow axis is focused and re-imaged by an individual spherical surface 22 located on the backside of the microlens array. Such compound microlens arrays are commercially available from LIMO Lissotschenko Mikrooptik, GmbH, Hauert 7, 44227, Dortmund, Germany. Although this embodiment provides a significant increase in performance, it is somewhat more difficult and costly to manufacture.

In accordance with the invention, the single-mode fibers from the integrated microlaser array can deliver optical pump power to a series of in-line EDFAs as shown in FIG. 13. The output from each pump element is fiber-coupled to an individual EDFA along chain of serial EDFAs to achieve very high gain and very high output power of the amplified input signal. The amplified output from each amplifier serves as the input to the next amplifier in the chain. An optical isolator ISO is used at the beginning of the amplifier chain to isolate the signal source form backward traveling ASE. Isolators are, likewise, distributed in-between the individual amplifiers to reduce feedback from backward traveling ASE, which competes with the signal for the available gain. Alternatively, as shown as shown in FIG. 14, the single-mode fibers 16 of FIGS. 1 and 2 can couple optical pump power from the integrated microlaser to a parallel multi-channel EDFA device. An optical isolator ISO isolates each signal source from backward traveling amplified spontaneous emission (ASE), and a fiber bragg grating (FBG) is used to couple pump radiation in and out of the single mode fiber carrying the input and amplified output optical signal. The number of EDFA channels that can be packaged into a single multi-channel EDFA device is roughly equivalent to the number of emitters in the pump laser diode array employed 19 emitters per cm is typical. Each EDFA channel contains the necessary spectral bandwidth to amplify several hundreds of "wavelength" channels for DWDM dense-wavelength division multiplexing. Therefore, the total number of "signal" channel that can be amplified by this device is equivalent to the product of the number of EDFA channels and the number of wavelength channels that can be supported by each EDFA.

This embodiments shown in FIGS. 13 and 14 are capable of delivering more that 300-mW per microlaser channel of 946-nm pump power to individual EDFAs. Up to 19-microlasers can be stacked per 1-cm using the Coherent B1-81-40C-19-30-A diode bar array as a pump source. The performance of each microlaser in this example can be improved by a factor of 1.24 by reshaping the slow axis along with the fast axis radiation from the diode emitter to achieve smaller pump beam over a longer doped crystal length.

What has been described is deemed to be illustrative of the principles of the invention. Further and other modifications will be apparent to those skilled in the art and may be made without, however, departing from the spirit and scope of the invention.

What is claimed is:

1. A microlaser power source comprising:
    a multi-mode wide stripe laser diode and a crystal structure adjoining said diode, said structure having a cavity adapted to be pumped by said diode, said crystal structure having an $Nd^{3+}$ doped section and an un-doped section, wherein the axial length L1 of said doped section is chosen to optimize energy absorption from said diode while minimizing resonant re-absorption loss to unpumped $Nd^{3+}$ ions.

2. A microlaser power source according to claim 1 wherein said undoped section has an axial length L2 chosen to optimize the lowest order spatial mode of the pumped region of said structure.

3. A microlaser power source according to claim 1 having a parameter set selected from the group consisting of doped length, doping concentration, pump beam spot size, micro laser cavity length, and output coupler reflectivity, said parameter set being varied to determine said overall axial length L1 which maximizes a single mode of output power $P_{cw}$ of said laser.

4. A microlaser power source according to claim 3 wherein said parameter set is varied to maximize said output power $P_{cw}$, where $$P_{cw} = \frac{\langle A_L \rangle I_{sat}}{2\beta} \frac{\delta_{OC}(1+B)}{(1+f_{eff})}[\langle \eta_{CW} \rangle - 1]$$

in which $$\langle A_L \rangle = \int i_L(r) dA_h$$

is the effective laser mode (beam) area within the host crystal;

$$I_{sat} = \frac{h\nu_L}{f_a \sigma_{em} t_a}$$

is the saturation intensity of the active laser ions with in the laser host crystal;

$$\beta = \frac{\int i_L^2(r) i_P(r) dA_h}{\int i_L(r) i_P(r) dA_h}$$

is a field overlap factor;

$$\delta_{OC} = -\ln R_{OC}$$

is the output coupler reflectivity loss exponent;

$$B = \frac{2 f_b \sigma_{abs} n_o l_h}{\delta}$$

is the ratio of the resonant re-absorption loss to passive roundtrip cavity loss;

$$f_{eff} = \frac{f_b \sigma_{abs}}{f_a \sigma_{em}}$$

is the effective bottle-necking parameter; and $$\langle \eta_{CW} \rangle = \frac{2}{\delta(1+B)} \left(\frac{I_{av}}{I_{sat}}\right)$$

is the spatially-averaged CW inversion density ratio.

5. A microlaser power source according to claim 1 including a mode-matching lens interposed between said laser diode and the doped section of said crystal.

6. A microlaser power source according to claim 5 wherein said lens concentrates the light from said diode into a beam of predetermined width entering said doped section of said crystal structure.

7. A microlaser power source according to claim 6 wherein said doped section is narrower than one dimension of said beam.

8. A microlaser power source according to claim 6 wherein said doped section is narrower than two dimensions of said beam.

9. A microlaser power source comprising:

a heat sink;

a multimode laser diode bar mounted on said heat sink;

a monolithic crystal structure adjoining said laser diode bar on said heat sink, said crystal structure having an $Nd^{3+}$ doped section and an un-doped section, wherein the axial length L1 of said doped section is chosen to optimize energy absorption from said diode while minimizing resonant re-absorption loss to unpumped $Nd^{3+}$ ions.

10. A microlaser power source according to claim 9 including mode-matching lens interposed between said laser diode and the doped section of said crystal.

11. A microlaser power source according to claim 10 wherein the multimode beam is conditioned by said lens to match the size of the doped section of said crystal.

12. A microlaser power source according to claim 11 wherein said lens divides said multimode beam into a plurality of beamlets each matching the size of a respective doped section of said crystal.

13. A microlaser power source according to claim 12 further comprising a heat sink, a plurality of single-mode fibers, and a lens array, said lens array coupling light from respective portions of said un-doped section into said plurality of single-mode fibers.

14. A microlaser power source according to claim 11 wherein said axial length L1 of said $Nd^{3+}$-doped crystal section has a value between 0.1 to 5-mm; the $Nd^{3+}$ doping concentration has a value between 0.25 to 5 weight percent; and the transverse size of said $Nd^{3+}$ doped section is between 0.1 to several times the size of the fundamental beam from said multimode crystal.

15. A microlaser power source according to claim 12 wherein the transverse size of the doped section is approximately half the mode size diameter.

16. A microlaser power source according to claim 14 wherein the output power of the microlaser is of the order of 700-mW per micro laser in the array.

* * * * *